US00RE45307E

(19) United States
(12) Reissued Patent
Nakamura et al.

(10) Patent Number: US RE45,307 E
(45) Date of Reissued Patent: Dec. 30, 2014

(54) NON-VOLATILE SEMICONDUCTOR STORAGE DEVICE

(71) Applicant: Kabushiki Kaisha Toshiba, Minato-ku (JP)

(72) Inventors: Dai Nakamura, Kawasaki (JP); Hiroyuki Kutsukake, Yokohama (JP); Kenji Gomikawa, Yokohama (JP); Takeshi Shimane, Matsudo (JP); Mitsuhiro Noguchi, Yokohama (JP); Koji Hosono, Fujisawa (JP); Masaru Koyanagi, Tokyo (JP); Takashi Aoi, Yokohama (JP)

(73) Assignee: Kabushiki Kaisha Toshiba, Minato-ku (JP)

(21) Appl. No.: 13/848,563

(22) Filed: Mar. 21, 2013

Related U.S. Patent Documents

Reissue of:
(64) Patent No.: 7,911,844
Issued: Mar. 22, 2011
Appl. No.: 12/337,808
Filed: Dec. 18, 2008

(30) Foreign Application Priority Data

Dec. 20, 2007 (JP) ..... 2007-328852

(51) Int. Cl.
*G11C 16/04* (2006.01)

(52) U.S. Cl.
USPC ..... 365/185.17; 365/185.05; 365/185.11; 365/185.12; 365/185.06; 365/185.18; 365/185.23; 365/185.27; 365/185.33; 365/182; 365/189.14; 365/230.03; 365/230.06; 365/230.02

(58) Field of Classification Search
USPC ..... 365/185.05, 185.11, 185.12, 185.14, 365/185.17, 185.06, 185.18, 185.23, 365/185.27, 185.33, 182, 189.14, 230.03, 365/230.06, 230.02
See application file for complete search history.

(56) References Cited

U.S. PATENT DOCUMENTS 6,621,735 B2 * 9/2003 Nakamura et al. ..... 365/185.17
6,912,157 B2 6/2005 Nakamura et al.

(Continued)

FOREIGN PATENT DOCUMENTS

JP 2007-81041 3/2007
KR 1020030087945 11/2003

OTHER PUBLICATIONS

Notice of Allowance issued Nov. 25, 2010, in Korean Patent Application No. 10-2008-130673 (with English-language Translation).

(Continued)

*Primary Examiner* — Fernando Hidalgo
(74) *Attorney, Agent, or Firm* — Oblon, Spivak, McClelland, Maier & Neustadt, L.L.P.

(57) ABSTRACT

A non-volatile semiconductor storage device includes: a memory cell array having memory cells arranged therein, the memory cells storing data in a non-volatile manner; and a plurality of transfer transistors transferring a voltage to the memory cells, the voltage to be supplied for data read, write and erase operations with respect to the memory cells. Each of the transfer transistors includes: a gate electrode formed on a semiconductor substrate via a gate insulation film; and diffusion layers formed to sandwich the gate electrode therebetween and functioning as drain/source layers. Upper layer wirings are provided above the diffusion layers and provided with a predetermined voltage to prevent depletion of the diffusion layers at least when the transfer transistors become conductive.

38 Claims, 10 Drawing Sheets

(56) References Cited

U.S. PATENT DOCUMENTS

| | | | | |
|---|---|---|---|---|
| 7,085,162 | B2 | 8/2006 | Nakamura et al. | |
| 7,245,534 | B2 * | 7/2007 | Goda et al. | 365/185.17 |
| 7,286,402 | B2 | 10/2007 | Nakamura et al. | |
| 8,294,238 | B2 | 10/2012 | Kutsukake et al. | |
| 8,334,557 | B2 | 12/2012 | Kutsukake | |
| 2005/0133814 | A1 * | 6/2005 | Yoshida et al. | 257/127 |
| 2007/0057280 | A1 * | 3/2007 | Hayashi et al. | 257/127 |
| 2010/0124117 | A1 | 5/2010 | Kutsukake et al. | |
| 2010/0195391 | A1 | 8/2010 | Minamoto et al. | |

OTHER PUBLICATIONS

U.S. Appl. No. 12/765,477, filed Apr. 22, 2010, Kutsukake, et al.

U.S. Appl. No. 12/618,200, filed Nov. 13, 2009, Kutsukake, et al.

U.S. Appl. No. 12/695,623, filed Jan. 28, 2010, Minamoto, et al.

U.S. Appl. No. 12/857,858, filed Aug. 17, 2010, Kutsukake.

* cited by examiner

NON-VOLATILE SEMICONDUCTOR STORAGE DEVICE

Matter enclosed in heavy brackets [ ] appears in the original patent but forms no part of this reissue specification; matter printed in italics indicates the additions made by reissue.

CROSS REFERENCE TO RELATED APPLICATIONS

This application is based on and claims the benefit of priority from prior Japanese Patent Application No. 2007-328852, filed on Dec. 20, 2007, the entire contents of which are incorporated herein by reference.

BACKGROUND OF THE INVENTION

1. Field of the Invention

The present invention relates to a non-volatile semiconductor storage device, and, more particularly, a non-volatile semiconductor storage device including transfer transistors to transfer a high voltage.

2. Description of the Related Art

Conventionally, NAND cell type flash memory configures each NAND cell block with a plurality of memory cells connected in series, allowing information to be stored in a non-volatile manner. It has attracted public attention as one of semiconductor storage devices that may achieve high integration. Each memory cell in the NAND cell type flash memory has a FETMOS structure where floating gates (charge accumulation layers) and control gates are laminated on a semiconductor substrate via an insulation film. In addition, there are multiple memory cells connected in series to configure a NAND cell so that a source and a drain are shared between the adjacent ones of the memory cells, which are in turn connected to a corresponding bit line as a unit. Such NAND cells are arranged in a matrix form to configure a memory cell array. The memory cell arrays are integrally formed in a p-type semiconductor substrate or a p-type well area. The drains located at one end of the NAND cells aligned in the column direction of the memory cell array are connected to a bit line via respective selection gate transistors, while the sources located at the other end are also connected to a common source line via respective selection gate transistors. The control gate of each memory transistor and the gate electrode of each selection gate transistor are commonly connected in the row direction of the corresponding memory cell array as a control gate line (word line) and a selection gate line, respectively.

In the NAND cell type flash memory, for example, in writing or erasing data, it is necessary to transfer a voltage higher than the power supply voltage to both the selected control gate line and non-selected control gate lines in the selected block. To transfer such a high voltage to the memory cells, conventional NAND cell type flash memory is provided with a row decoder circuit including transfer transistors with high breakdown voltage (see, for example, Japanese Patent Laid-Open No. 2002-63795). A large number of transfer transistors are also provided in the peripheral circuitry other than the row decoder to transfer such a high voltage.

The flash memory must be able to transfer a sufficient amount of desired writing potentials, in order to meet the requirements of refinement and multi-level cells (MLC), to make the area of the peripheral circuitry other than the cell arrays as small as possible, and to accommodate multi-value write operations.

However, these transfer transistors with such high breakdown voltage may not transfer a sufficient amount of high voltage to be transferred, which could lead to malfunction, etc.

SUMMARY OF THE INVENTION

One aspect of the present invention provides a non-volatile semiconductor storage device comprising: a memory cell array having memory cells arranged therein, the memory cells storing data in a non-volatile manner; and a plurality of transfer transistors transferring a voltage to the memory cells, the voltage to be supplied for data read, write and erase operations with respect to the memory cells; each of the plurality of transfer transistors comprising: a gate electrode formed on a semiconductor substrate via a gate insulation film; diffusion layers formed to sandwich the gate electrode therebetween and functioning as drain/source layers; and upper layer wirings provided above the diffusion layers and provided with a predetermined voltage to prevent depletion of the diffusion layers at least when the transfer transistors become conductive.

DETAILED DESCRIPTION OF THE EMBODIMENTS

Embodiments of the present invention will now be described below with reference to the accompanying drawings.

First Embodiment

Figure 1:
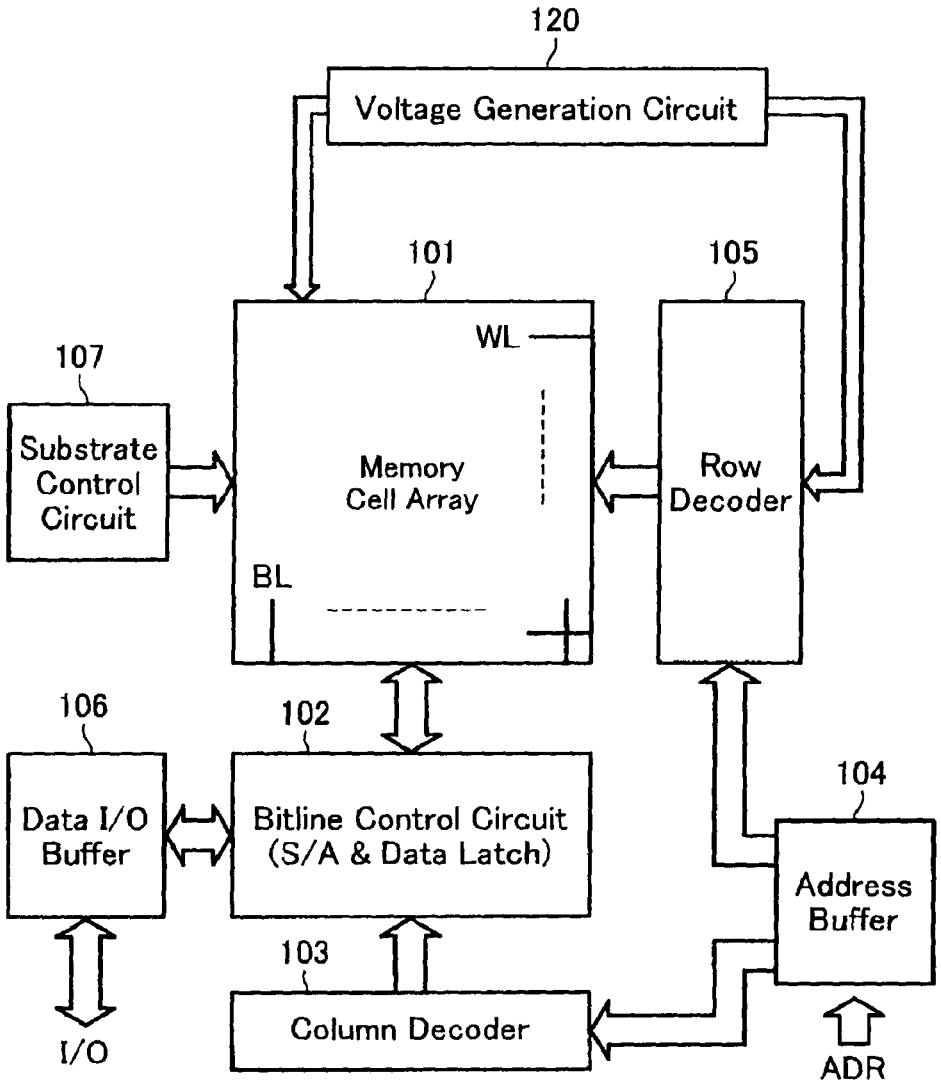
FIG. 1 is a block diagram illustrating a general configuration of a NAND cell type flash memory according to a first embodiment of the present invention.

FIG. 1 is a block diagram illustrating a general configuration of a NAND cell type flash memory according to a first embodiment of the present invention.

A bit line control circuit (sense amplifier and data latch) 102 is provided for data writing, reading, rewriting and verify reading operations with respect to a memory cell array 101. The bit line control circuit 102 is connected to a data input/output buffer 106 and receives, as its input, an output from a column decoder 103 that receives an address signal provided by an address buffer 104.

In addition, a row decoder 105 for controlling control gates and selection gates, and a substrate potential control circuit 107 for controlling the potential of a p-type silicon substrate (or p-type well area) on which the memory cell array 101 is formed are provided with respect to the memory cell array 101. A voltage generation circuit 120 is also provided as a circuit for generating voltage supplied to the memory cells, etc., that is necessary for writing, reading or the like.

The bit line control circuit 102 mainly comprises CMOS flip-flops to latch data for writing, perform sensing operations for reading the potential of a bit line and for verify reading after a writing operation, and further latch the rewriting data.

Figure 2A:
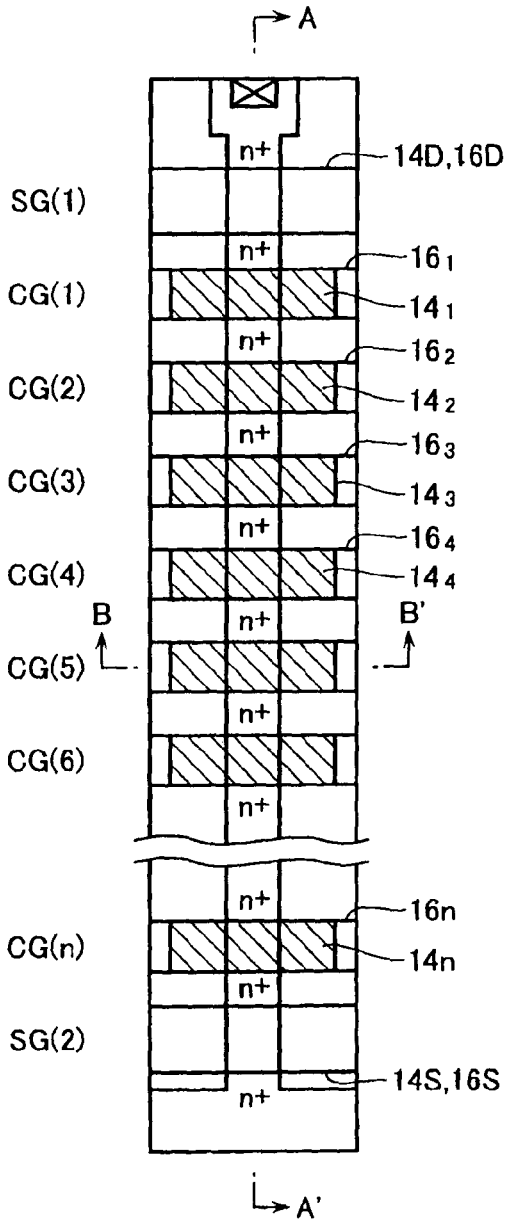
FIG. 2A is a plan view of one part of the NAND cells in the memory cell array 101 of FIG. 1.
Figure 2B:
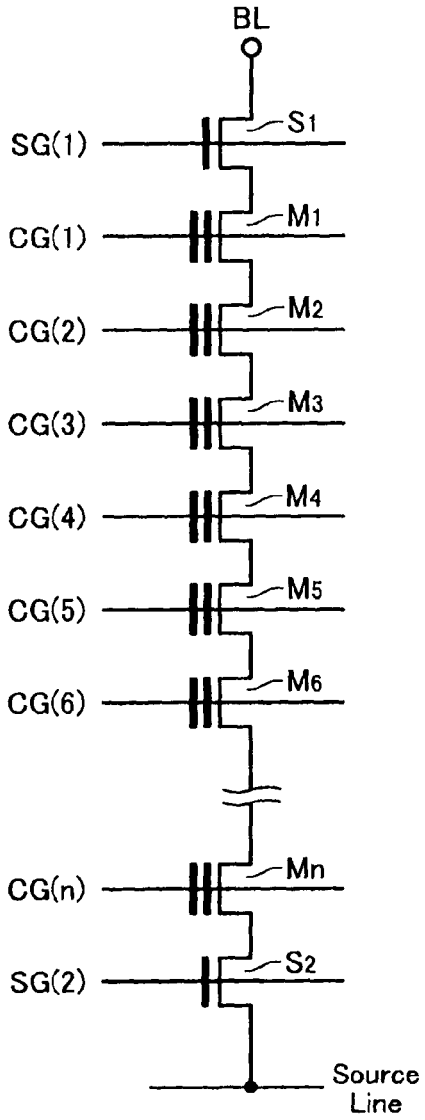
FIG. 2B is an equivalent circuit diagram of one part of the NAND cells in the memory cell array 101.
Figure 3A:
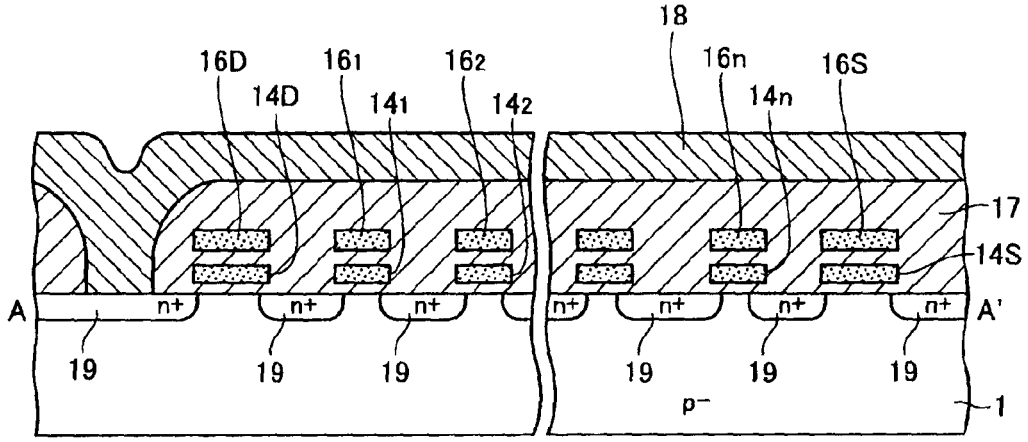
FIG. 3A is a cross-sectional view taken along line A-A' of FIG. 2A.
Figure 3B:
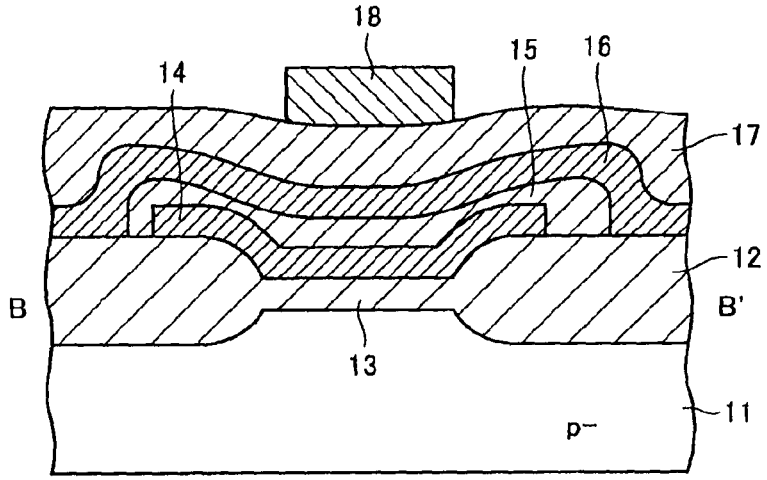
FIG. 3B is a cross-sectional view taken along line B-B' of FIG. 2A.

FIGS. 2A and 2B are a plan view and an equivalent circuit diagram of one part of the NAND cells in the memory cell array 101, and FIGS. 3A and 3B are cross-sectional views taken along lines A-A' and B-B' of FIG. 2A. A memory cell array including a plurality of NAND cells is formed on a p-type silicon substrate (or p-type well area) 11 surrounded by a device isolation oxide film 12. In this embodiment, for example, focusing on one NAND cell, n memory cells M1-Mn are connected in series to configure one NAND cell.

Each of the memory cells M1-Mn is configured in such a way that a floating gate 14 ($\mathbf{14}_1$, $\mathbf{14}_2$, . . . , $\mathbf{14}_n$) is formed on the substrate 11 via a gate insulation film 13, on which a control gate 16 (=word lines: $\mathbf{16}_1$, $\mathbf{16}_2$, . . . , $\mathbf{16}_n$) is further formed via an insulation film 15. N-type diffusion layers 19 corresponding to the sources and drains of these memory cells are connected so as to be shared by the adjacent ones, by which the memory cells are connected in series.

Selection gates 14D, 16D, and 14S, 16S are formed on the drain side and the source side of the NAND cell. These selection gates 14D, 16D, and 14S, 16S are formed at the same time as the floating gates 14 and control gates 16 of the memory cells. These selection gates configures selection transistors S1 and S2.

The substrate 11 with the so-formed elements is covered with an insulation film 17, on which a bit line 18 is disposed. The bit line 18 is connected to those drain-side diffusion layers 19 located on one end of the NAND cell. The control gates 16 of the NAND cell that are aligned in the row direction are commonly disposed as control gate lines CG(1), CG(2), . . . , CG(n). These control gates represent word lines. The selection gates 14D, 16D, and 14S, 16S are also disposed in the column direction in a continuous manner as selection gate lines SG(1) and SG(2), respectively.

Figure 4:
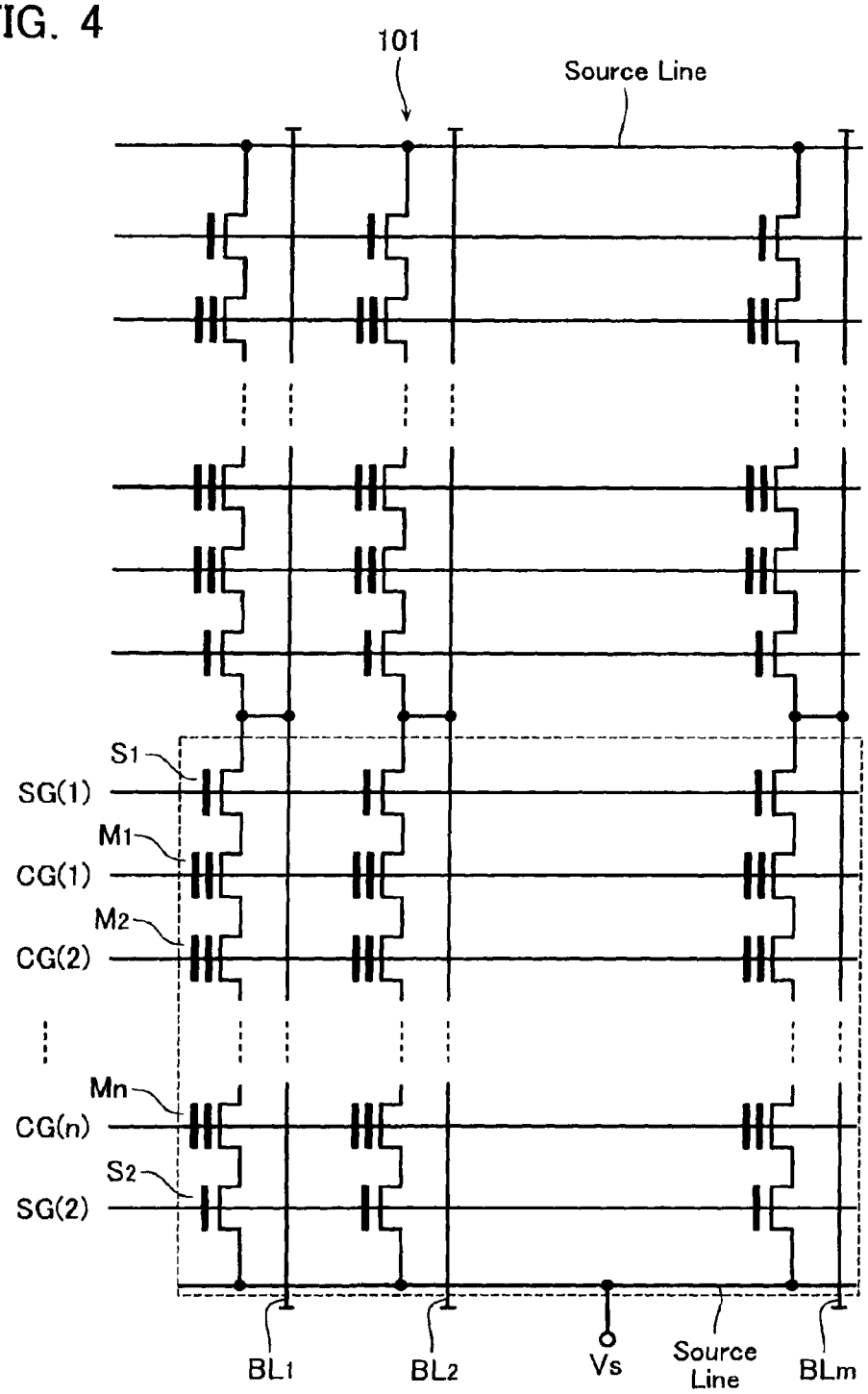
FIG. 4 illustrates an equivalent circuit of the memory cell array 101 having NAND cells arranged therein in a matrix form.

FIG. 4 illustrates an equivalent circuit of the memory cell array 101 having such NAND cells arranged therein in a matrix form. A group of NAND cells that shares the same word lines and the same selection gate lines, indicated by an area illustrated by the dotted line of FIG. 4, is referred to as "one block". In normal reading and writing operations, only one of multiple blocks is selected (which is, hereinafter, referred to as the "selected block").

Figure 5:
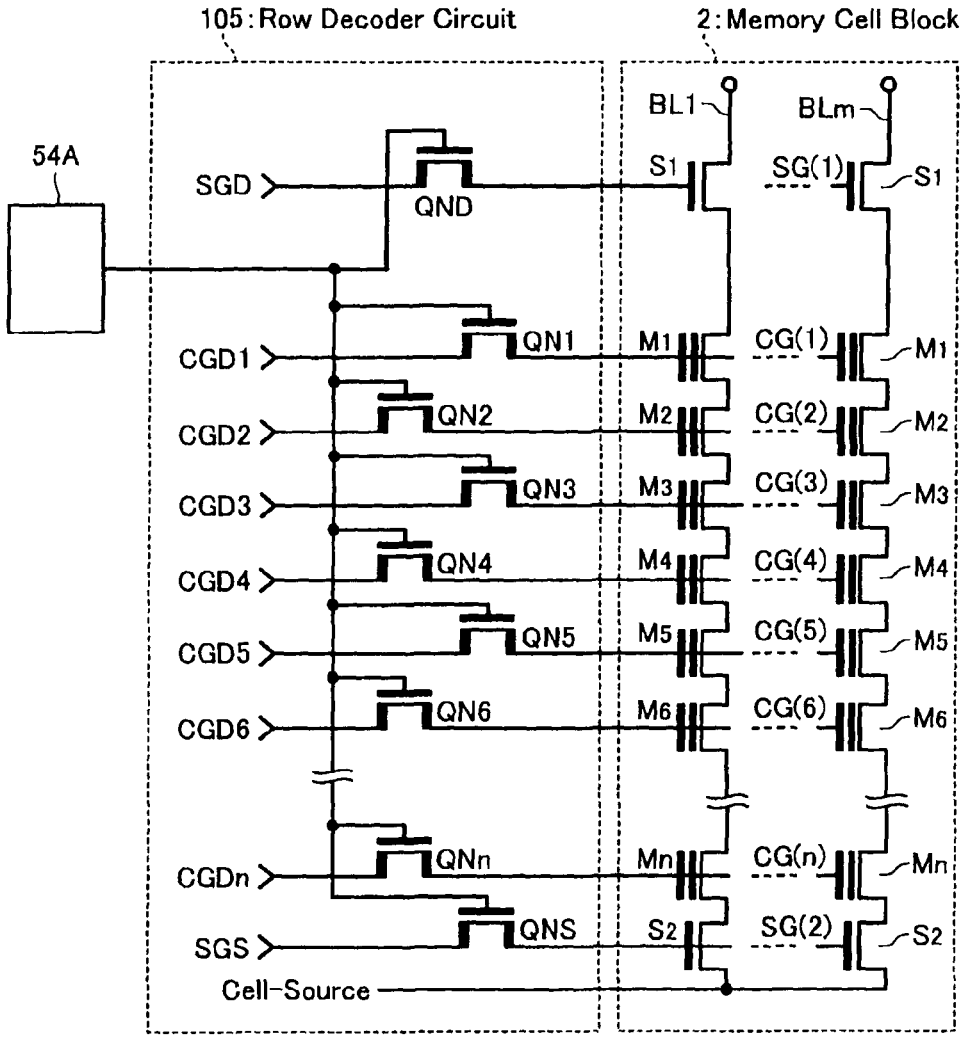
FIG. 5 illustrates an example configuration of the row decoder 105 illustrated in FIG. 1.

FIG. 5 illustrates an example configuration of the row decoder 105. In the case of FIG. 5, a row decoder circuit that configures the row decoder 105 is positioned at one end of a memory cell block 2 in the memory cell array 101. The row decoder circuit 105 comprises transfer transistors QN0-QNn, QND, and QNS that are connected to the control gate lines CG(1)-CG(n) and the selection gate lines SG(1) and SG(2), respectively. In addition, each one of the transfer transistors QN1-QNn is connected to the respective one of the control gate lines CG(1)-CG(n).

That is, a current path for respective one of the transfer transistors QN1-QNn is connected between each one of the control gate lines CG(1)-CG(n) and each one of signal input nodes CGD1-CGDn. In addition, the current path of the transfer transistor QND is connected between the selection gate line SG(1) and its signal input node SGD. Further, the current path of the transfer transistor QNS is connected between the selection gate line SG(2) and its signal input node SGS. A voltage switching circuit 54A is also provided for setting the gate voltages of the transfer transistors QN0-QNn, QND, and QNS to switch the voltages of the control gate lines CG(1)-(n), the selection gate line SG(1) and SG(2). Besides, it is herein assumed that all of the transfer transistors QN0-QNn, QND, and QNS represent enhancement-type n-type MOS transistors.

As described above, the row decoder circuit 105 comprises the transfer transistors QN0-QNn, QND, and QNS for transferring a high voltage such as a writing voltage (not less than 20V) to a word line WL, the selection gate lines SG(1) and SG(2). Such transistors for transferring a high voltage are provided not only in the row decoder circuit 105, but, for example, in the above-mentioned substrate potential control circuit 107 or the voltage switching circuit 54A.

When transferring a high voltage VD from a drain-side node (in the case of n-channel type MOSFET) using these transfer transistors QN0-QNn, QND, and QNS, the voltage VD plus a threshold voltage Vth (VD+Vth) is applied to the corresponding gate electrode. As a result, the potential on the source side of the transistors becomes a desired potential VD.

Figure 6A:
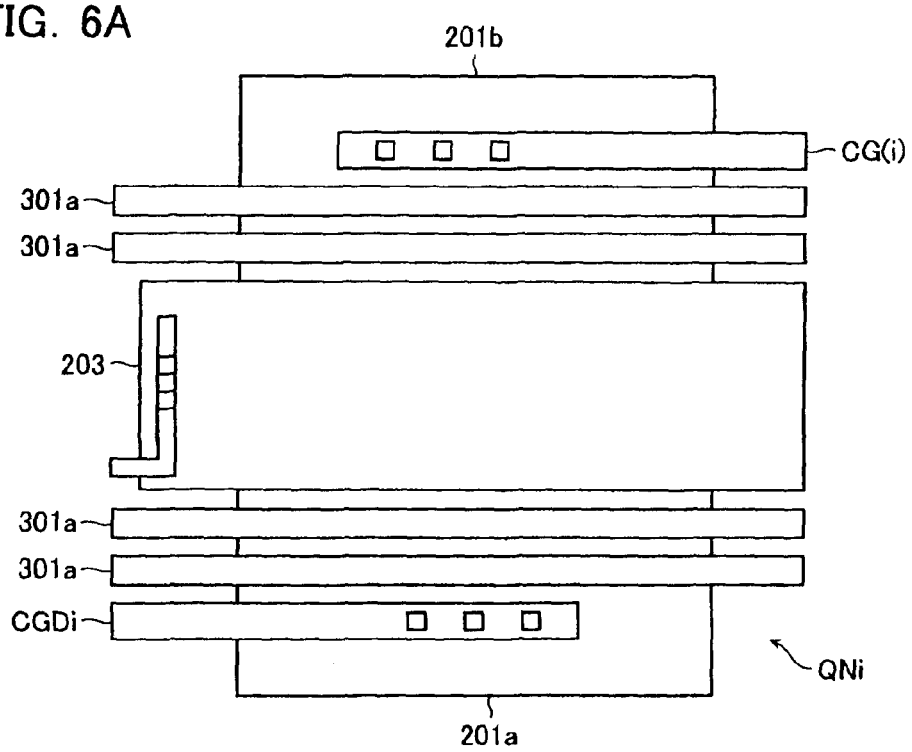
FIG. 6A is a plan view of a common transfer transistor QNi.
Figure 6B:
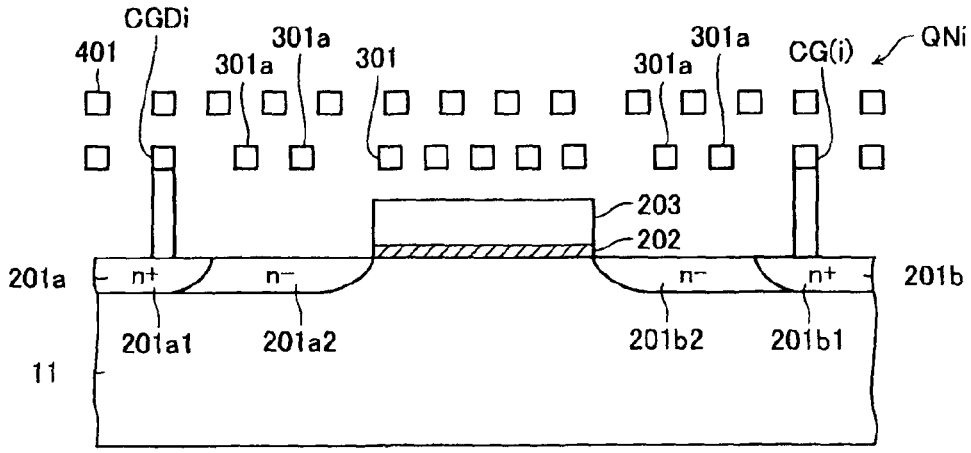
FIG. 6B is a cross-sectional view of the common transfer transistor QNi.

FIGS. 6A and 6B are a plan view and a cross-sectional view of a common transfer transistor QNi (hereinafter, i=1 to n). A transfer transistor QNi comprises an n-type drain diffusion area 201a and a source diffusion area 201b on the p-type silicon substrate 11. Note that the drain diffusion area 201a has a high concentration area 201a1 and an LDD area 201a2 with a lower impurity concentration than the high concentration area 201a1. Similarly, the source diffusion area 201b has a high concentration area 201b1 and an LDD area 201b2 with a lower impurity concentration than the high concentration area 201b1.

A signal input node CGDi is connected to the drain diffusion area 201a via a contact, while a control gate line CG(i) is connected to the source diffusion area 201b. A gate electrode 203 is formed at a position between the drain diffusion area 201a and the source diffusion area 201b via a gate insulation film 202.

There are many wirings 301 disposed on the transfer transistor QNi that are independent of the transfer transistor QNi. Examples of the wirings 301 include lead wirings of a control gate CG(i), etc. These wirings 301 could have a negative impact on the operation of the transfer transistor QNi depending on the magnitude of the applied voltage. Particularly, if the voltage applied to those wirings 301 running above the drain diffusion area 201a and the source diffusion area 201b is smaller (e.g., 0V) than the high voltage transferred by the transfer transistor QNi, then a sufficient amount of voltage cannot be transferred, which could cause malfunction in the flash memory.

That is, when a predetermined gate voltage (VD+Vth) is provided to the gate electrode 203 of the transfer transistor QNi, then a high voltage VD is supplied from the drain and transferred to the source side, the drain diffusion area 201a and the source diffusion area 201b are depleted due to the wiring 301a to which 0V has been applied. This may lead to an increase in respective resistance of the drain diffusion area 201a and the source diffusion area 201b such that a desired voltage VD cannot be transferred to the source side. Particularly, a sufficient margin cannot be obtained when writing multi-value data to one memory cell MC.

To address this problem, a method is also applicable to provide the wirings 301 by bypassing above the drain diffusion area 201a and the source diffusion area 201b. However, if there exists an additional low-potential wiring on the upper layer, the effects, as mentioned above, due to this wiring are not negligible.

Figure 7A:
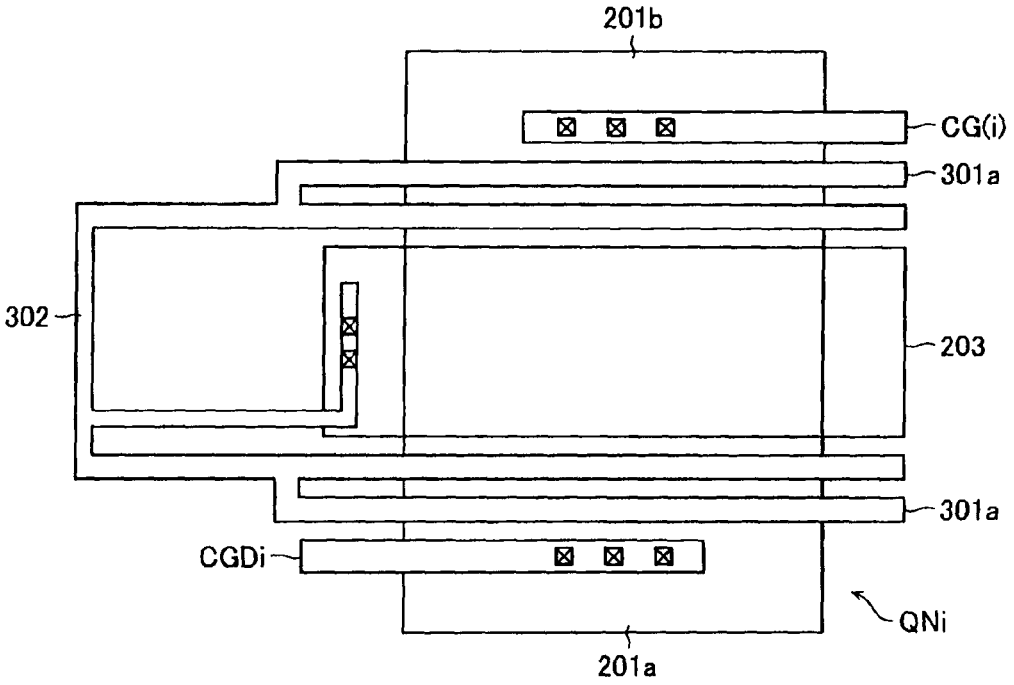
FIG. 7A is a plan view illustrating a configuration of a transfer transistor QNi according to the first embodiment.
Figure 7B:
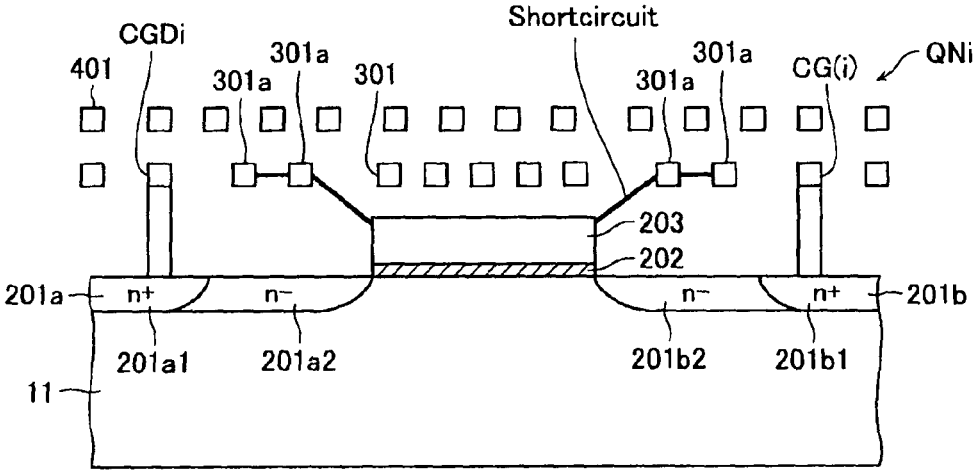
FIG. 7B is a cross-sectional view illustrating a configuration of the transfer transistor QNi according to the first embodiment.

FIGS. 7A and 7B are a plan view and a cross-sectional view illustrating a configuration of a transfer transistor QNi according to the first embodiment. In this embodiment, those wirings 301a that are located above the drain diffusion area 201a and the source diffusion area 201b (in particular, the LDD areas 201a2 and 201b2) are short-circuited to the gate electrode 203 through a short-circuit wiring 302, thereby providing dummy wirings (in the case of FIGS. 7A and 7B, dummy wirings are only formed above the LDD areas 201a2 and 201b2). Thus, when a predetermined gate voltage is supplied to the gate electrode 203, the same voltage is also supplied to the wirings 301a. This may prevent depletion of the drain diffusion area 201a and the source diffusion area 201b in transferring a high voltage by the transfer transistor QNi and allow the high voltage to be transferred successfully. In addition, upon formation of the wirings 301a being short-circuited to the gate electrode 203, the wirings 301 function as shielding wires for the wirings on the upper layer. Accordingly, an improved degree of freedom may be provided for the wiring layout of the wirings on the upper layer.

Note that it is preferable to allow a sufficient distance between the wirings 301a short-circuited to the gate electrode 203 and the other wirings to prevent an increase in parasitic capacitance due to the coupling.

Figure 8:
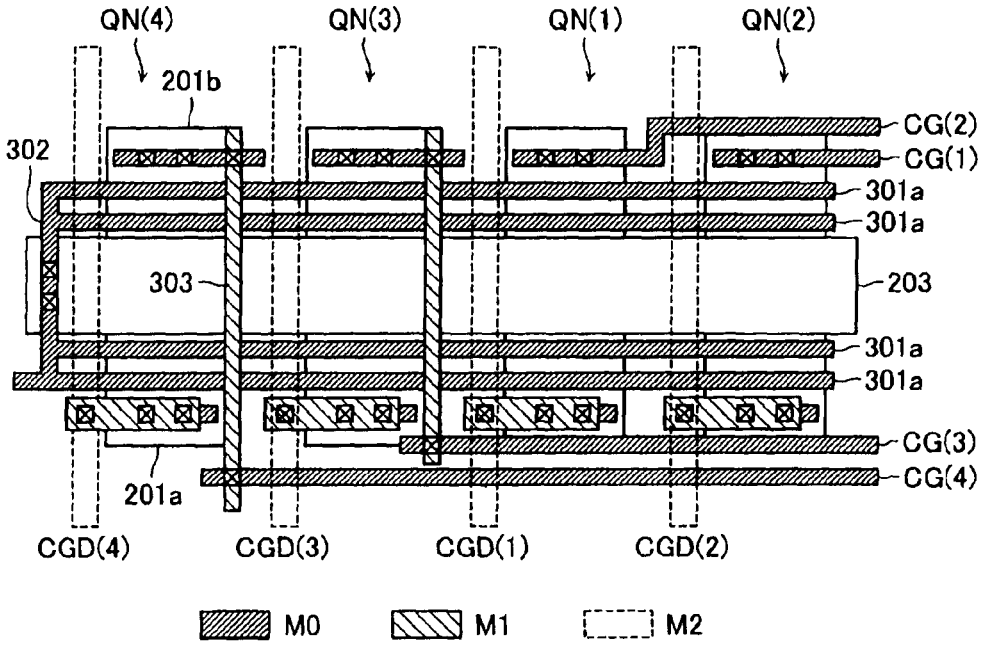
FIG. 8 illustrates an example wiring layout located above a plurality of transfer transistors QNi.

FIG. 8 illustrates an example wiring layout located above a plurality of transfer transistors QNi. The transfer transistors QNi share one gate electrode 203. In FIG. 8, each wiring includes M0 wirings on the bottom layer, M1 wirings on the upper layer, and further M2 wirings on the top of the upper layer.

The above-mentioned wirings 301a and the short-circuit wiring 302 are configured by the M0 wirings on the bottom layer. The short-circuit wiring 302 is electrically connected to the gate electrode 203 via a contact. The wirings 301a which represent dummy wirings are formed across the plurality of transfer transistors QNi and connected to the short-circuit wiring 302 at one position so that a voltage is supplied thereto by the gate electrode 203.

The signal input node CGDi is connected to the drain diffusion area 201a of each transfer transistor QNi and configured by three layers of the M0, M1 and M2 wirings. In addition, the control gate lines CG(0) and CG(1) are drawn by connecting the M0 wirings to the source diffusion area 201b via a contact. The control gate lines CG(2) and CG(3) are drawn by connecting M0 wirings to M1 wirings 303 via a contact and further connecting the M1 wirings 303 to other M1 wirings.

Note that, in this embodiment, the wirings 301a are provided that are supplied with a predetermined voltage when a predetermined gate voltage is supplied to the gate of the transfer transistor QNi (FIG. 7A). However, the configuration as illustrated in FIG. 7A is useful when the transfer transistor QNi is an enhancement-type n-type MOS transistor. If the transfer transistor QNi is a depression-type n-channel type MOS transistor, then the configuration as illustrated in FIG. 6A might be preferable rather than that illustrated in FIG. 7A. That is, as illustrated in FIG. 6A, it might be preferable for the depression-type to provide those wirings 301a where a fixed voltage smaller than the gate voltage, e.g., 0V is applied on the diffusion layers 201a and 201b. This is for the following reasons:

The depression-type MOS transistors have higher impurity concentration in their channels in which large current flows than that of the enhancement-type. In addition, a surface breakdown voltage is required to cut off the high voltage. To this extent, the depression-type MOS transistors provide a lower surface breakdown voltage than the enhancement-type MOS transistors due to the higher impurity concentration involved in their channels. Thus, it is preferable that a voltage of, e.g., 0V, that is lower than the voltage applied to the gate electrode 203 is always applied to those wirings 301a that are disposed on the diffusion layers 201a and 201b of the depression-type MOS transistors. Consequently, a higher diffusion-layer resistance may be provided in the diffusion layers 201a and 201b, thereby improving the surface breakdown voltage. In addition to this, further improvements may be achieved if those wirings (in particular, the M0 wirings) to which the high voltage is applied are not positioned adjacent the diffusion layers 201a and 201b.

If there are both enhancement-type n-type MOS transistors and depression-type n-type MOS transistors in one memory chip as transfer transistors, it is preferable for the latter to employ the wiring layout as illustrated in FIG. 6A and for the former the wiring layout as illustrated in FIG. 7A, as needed.

Second Embodiment

Figure 9:
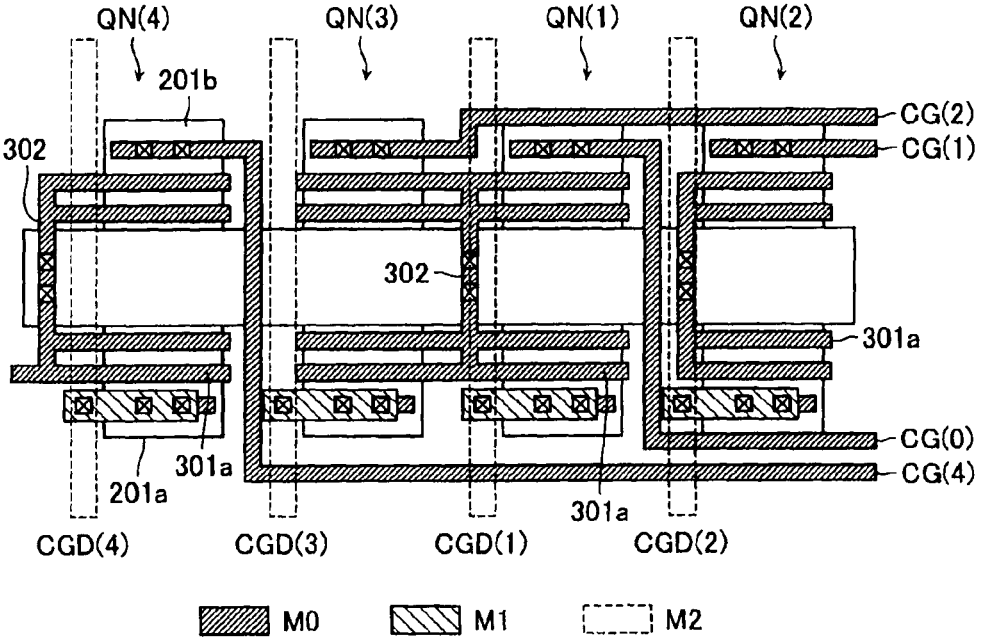
FIG. 9 illustrates an example wiring layout according to a second embodiment of the present invention.

Referring now to FIG. 9, a second embodiment of the present invention will be described below. The second embodiment is different from the first embodiment in the wiring layout with respect to the transfer transistors QNi, while other features are the same as the first embodiment.

FIG. 9 is a plan view illustrating the wiring layout of the transfer transistors QNi provided in a non-volatile semiconductor storage device according to the second embodiment of the present invention. Besides, in FIG. 9, the same reference numerals represent the same components as the first embodiment and detailed description thereof will be omitted.

Note that this embodiment also has a preferable configuration to be applied to the enhancement-type MOS transistors. On the other hand, as with the first embodiment, it is often preferable for the depression-type MOS transistors to apply the configuration of FIG. 6A.

Further, if there is a mix of enhancement-type n-type MOS transistors and depression-type n-type MOS transistors in one memory chip as transfer transistors, it is preferable for the latter to employ the wiring layout as illustrated in FIG. 6A and for the former the wiring layout as illustrated in FIG. 9, as needed.

In this embodiment, the wirings 301a are arranged separately for each one or two transfer transistors QNi rather than being disposed common to the plurality of transfer transistors QNi. In addition, each separate wiring 301a is short-circuited to the gate electrode 203 through the short-circuit wiring 302. As can be seen, since the wirings 301a are separated in any suitable manner, other wirings may be formed at those portions resulting from the separation and hence providing an improved degree of freedom for the wiring layout.

Third Embodiment

Figure 10:
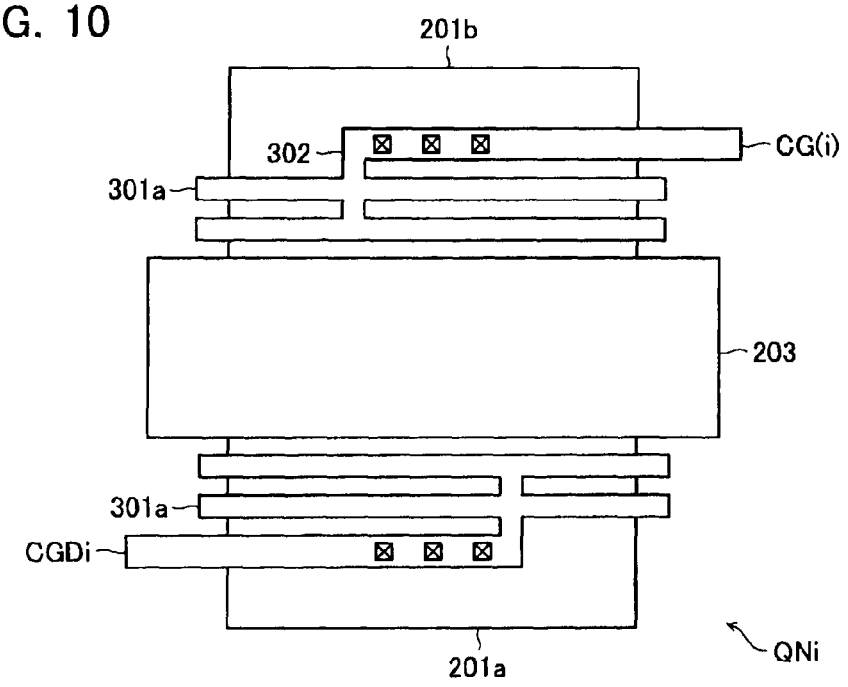
FIG. 10 illustrates an example wiring layout according to a third embodiment of the present invention.

Referring now to FIG. 10, a third embodiment of the present invention will be described below. The third embodiment is different from the first embodiment in the wiring layout with respect to the transfer transistors QNi, while other features are the same as the first embodiment.

FIG. 10 is a plan view illustrating the wiring layout of the transfer transistors QNi provided in a non-volatile semiconductor storage device according to the third embodiment of the present invention. Besides, in FIG. 10, the same reference numerals represent the same components as the first embodiment and detailed description thereof will be omitted. Note that this embodiment also has a preferable configuration to be applied to the enhancement-type MOS transistors. On the other hand, as with the first embodiment, it is often preferable for the depression-type MOS transistors to apply the configuration of FIG. 6A, as needed. If there is a mix of enhancement-type n-type MOS transistors and depression-type n-type MOS transistors in one memory chip as transfer transistors, it is preferable for the latter to employ the wiring layout as illustrated in FIG. 6A and for the former the wiring layout as illustrated in FIG. 10, as needed.

In this embodiment, as illustrated in FIG. 10, the wirings 301a which represent dummy wirings are not connected to the gate electrode 203, but instead to a control gate line CG(i) or a signal input node CGDi via a short-circuit wiring 302. Also with this configuration, it is possible to prevent depletion of the diffusion areas 201a and 201b when the transfer transistors QNi are conductive, which may provide the same advantages as the above-mentioned embodiments.

Figure 11:
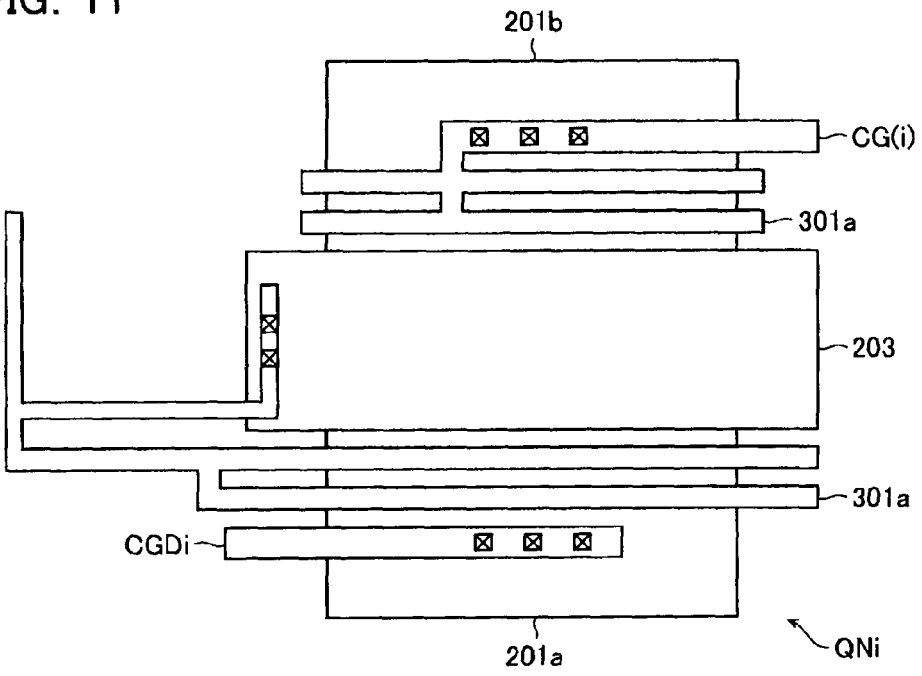
FIG. 11 illustrates a variation of the embodiments of the present invention.
Figure 12:
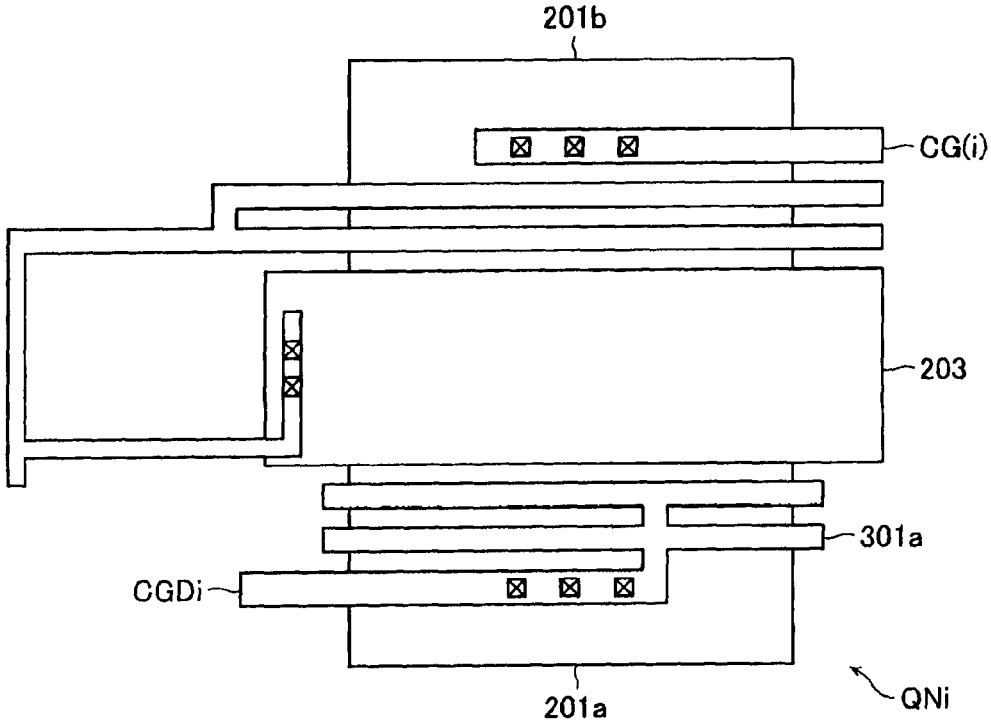
FIG. 12 illustrates another variation of the embodiments of the present invention.

While embodiments of the present invention have been described, the present invention is not intended to be limited to the disclosed embodiments and various other changes, additions or the like may be made thereto without departing from the spirit of the invention. For example, the above embodiments have been described with reference to the transfer transistors in the row decoder, the present invention is not limited to the disclosed embodiments and it is applicable to any transfer transistors that transfer a high voltage. The above embodiments may also be combined in any suitable manner. For example, as illustrated in FIG. 11, those wirings 301a on the drain diffusion area 201a may be short-circuited to the gate electrode 203, while those on the source diffusion area 201b may be short-circuited to the control gate lines CG(i). Conversely, as illustrated in FIG. 12, those wirings 301a on the drain diffusion area 201a may be short-circuited to the signal input nodes CGDi, while those on the source diffusion area 201b may be short-circuited to the gate electrode 203.

What is claimed is:

1. A non-volatile semiconductor storage device comprising:

a memory cell array having memory cells arranged therein, the memory cells storing data in a non-volatile manner; and a plurality of transfer transistors transferring a voltage to the memory cells, the voltage to be supplied for data read, write and erase operations with respect to the memory cells;

each of the plurality of transfer transistors comprising:

a gate electrode formed on a semiconductor substrate via a gate insulation film;

diffusion layers formed to sandwich the gate electrode therebetween and functioning as drain/source layers; and upper layer wirings provided above the diffusion layers, wherein the transfer transistors comprise enhancement-type transistors and depression-type transistors, the upper layer wirings provided above the transfer transistors corresponding to the enhancement-type transistors are provided with a predetermined voltage at least when the transfer transistors become conductive to prevent depletion of the diffusion layer, and the upper layer wirings provided above the transfer transistors corresponding to the depression-type transistors are supplied with a fixed voltage smaller than a voltage applied to their gates.

2. The non-volatile semiconductor storage device according to claim 1, further comprising:

a row decoder selecting a word line provided above the memory cell array, wherein the transfer transistors are included in the row decoder.

3. The non-volatile semiconductor storage device according to claim 1, wherein the upper layer wirings of the transfer transistors corresponding to the enhancement-type transistors are provided with the same voltage as that of the gate electrode.

4. The non-volatile semiconductor storage device according to claim 3, wherein the upper layer wirings of the transfer transistors corresponding to the enhancement-type transistors are short-circuited to the gate electrode.

5. The non-volatile semiconductor storage device according to claim 1, wherein the upper layer wirings of the transfer transistors corresponding to the enhancement-type transistors are provided with the same voltage as that of the diffusion layers.

6. The non-volatile semiconductor storage device according to claim 5, wherein the upper layer wirings of the transfer transistors corresponding to the enhancement-type transistors are short-circuited to the diffusion layers.

7. The non-volatile semiconductor storage device according to claim 1, further comprising:

a short-circuit wiring short-circuiting the upper layer wirings to the gate electrode.

8. The non-volatile semiconductor storage device according to claim 1, wherein the memory cell array comprises NAND cells including a plurality of serially-connected memory cells, and selection transistors connected to the NAND cells.

9. The non-volatile semiconductor storage device according to claim 1, wherein each of the diffusion layers comprises a high concentration area with a first impurity concentration and an LDD area with a second impurity concentration lower than the first impurity concentration.

10. The non-volatile semiconductor storage device according to claim 9, wherein the upper layer wirings are provided above the LDD areas.

11. The non-volatile semiconductor storage device according to claim 1, wherein the plurality of transfer transistors share the gate electrode as well as the upper layer wirings that are disposed in a continuous manner.

12. The non-volatile semiconductor storage device according to claim 1, wherein the plurality of transfer transistors share the gate electrode, and the upper layer wirings are separately disposed for one or two of the plurality of transfer transistors.

13. The non-volatile semiconductor storage device according to claim 1, further comprising:

a signal line electrically connected to the diffusion layers, wherein the upper layer wirings are short-circuited to the signal line.

14. A non-volatile semiconductor storage device comprising:

a memory cell array having memory cells arranged therein, the memory cells storing data in a non-volatile manner; and a plurality of transfer transistors transferring a voltage to the memory cells, the voltage to be supplied for data read, write and erase operations with respect to the memory cells;

each of the plurality of transfer transistors comprising:

a gate electrode formed on a semiconductor substrate via a gate insulation film;

diffusion layers formed to sandwich the gate electrode therebetween and functioning as drain/source layers; and upper layer wirings provided above the diffusion layers, wherein the transfer transistors comprise enhancement-type transistors and depression-type transistors, the upper layer wirings provided above the transfer transistors corresponding to the enhancement-type transistors are provided with the same voltage as applied to the diffusion layers or the gate voltage at least when the transfer transistors become conductive, and the upper layer wirings provided above the transfer transistors corresponding to the depression-type transistors are supplied with a fixed voltage smaller than a voltage applied to their gates.

15. The non-volatile semiconductor storage device according to claim 14, further comprising:

a row decoder selecting a word line provided above the memory cell array, wherein the transfer transistors are included in the row decoder.

16. The non-volatile semiconductor storage device according to claim 14, wherein the upper layer wirings of the transfer transistors corresponding to the enhancement-type transistors are short-circuited to the gate electrode.

17. The non-volatile semiconductor storage device according to claim 14, wherein the upper layer wirings of the transfer transistors corresponding to the enhancement-type transistors are short-circuited to the diffusion layers.

18. A non-volatile semiconductor storage device comprising:

a memory cell array having memory cells arranged therein, the memory cells storing data in a non-volatile manner; and a plurality of transfer transistors transferring a voltage to the memory cells, the voltage to be supplied for data read, write and erase operations with respect to the memory cells;

each of the plurality of transfer transistors comprising:

a gate electrode formed on a semiconductor substrate via a gate insulation film;

diffusion layers formed to sandwich the gate electrode therebetween and functioning as drain/source layers; and upper layer wirings provided above the diffusion layers and provided with a predetermined voltage to prevent depletion of the diffusion layers at least when the transfer transistors become conductive, wherein the plurality of transfer transistors share the gate electrode, and the upper layer wirings are separately disposed for one or two of the plurality of transfer transistors.

*19. A non-volatile semiconductor storage device comprising:*

*a memory cell array including a plurality of memory cells, the memory cells storing data in a non-volatile manner;*

*a plurality of transfer transistors configured to transfer a voltage to the memory cells, each of the plurality of transfer transistors including a gate electrode formed on a semiconductor substrate via a gate insulation film and drain/source regions formed to sandwich the gate electrode therebetween; and*

*first wirings connected to the drain/source regions of the plurality of transfer transistors via contacts respectively, each of the first wirings including a first line provided above one of the drain/source regions; and*

*upper layer wirings provided above the drain/source regions of the plurality of transfer transistors, each of the upper layer wirings including a plurality of second lines located near the gate electrode as compared to the first line above the one of the drain/source regions, the plurality of second lines extending parallel with each other,*

*wherein the plurality of transfer transistors share the gate electrode, and the upper layer wirings are separately disposed for one or two of the plurality of transfer transistors.*

*20. The non-volatile semiconductor storage device according to claim 19, further comprising a row decoder selecting a word line provided above the memory cell array, wherein the transfer transistors are included in the row decoder.*

*21. The non-volatile semiconductor storage device according to claim 19, wherein both the first line and the plurality of second lines extend in the first direction.*

*22. The non-volatile semiconductor storage device according to claim 19, further comprising second wirings connected to the drain/source regions of the plurality of transfer transistors via contacts respectively, each of the second wirings including a third line provided above the other of the drain/source regions; and*

*wherein a plurality of fourth lines are provided near the gate electrode as compared to the third line above the other of the drain/source regions, the plurality of fourth lines extending parallel with each other.*

*23. The non-volatile semiconductor storage device according to claim 22, further comprising a row decoder selecting a*

*word line provided above the memory cell array, wherein the transfer transistors are included in the row decoder.*

*24. The non-volatile semiconductor storage device according to claim 19, wherein both the first line and the plurality of second lines are arranged in a same layer.*

*25. The non-volatile semiconductor storage device according to claim 22, wherein the first line, the plurality of second lines, the third line, and the plurality of fourth lines are arranged in a same layer.*

*26. The non-volatile semiconductor storage device according to claim 19, wherein the plurality of second lines are connected to the first line.*

*27. The non-volatile semiconductor storage device according to claim 19, wherein the plurality of second lines are arranged in a same layer as lead wirings of control gates of the plurality of memory cells.*

*28. The non-volatile semiconductor storage device according to claim 19, wherein the upper layer wirings are separately disposed for one of the plurality of transfer transistors.*

*29. The non-volatile semiconductor storage device according to claim 22, wherein the plurality of fourth lines are connected to the third line.*

*30. A non-volatile semiconductor storage device comprising:*

*a memory cell array including a plurality of memory cells, the memory cells storing data in a non-volatile manner;*

*a plurality of transfer transistors configured to transfer a voltage to the memory cells, each of the plurality of transfer transistors including a gate electrode formed on a semiconductor substrate via a gate insulation film and drain/source regions formed to sandwich the gate electrode therebetween; and*

*wirings provided above the drain/source regions of the plurality of transfer transistors, each of the wirings including a first portion and a second portion both provided above one of the drain/source regions, the first portion being connected to the one of the drain/source regions via a contact and the second portion being arranged between the first portion and the gate electrode,*

*wherein the plurality of transfer transistors share the gate electrode, and*

*the wirings are separately disposed for one or two of the plurality of transfer transistors.*

*31. The non-volatile semiconductor storage device according to claim 30, wherein the second portion is not connected to the one of the drain/source regions directly via a contact.*

*32. The non-volatile semiconductor storage device according to claim 30, further comprising a row decoder selecting a word line provided above the memory cell array, wherein the transfer transistors are included in the row decoder.*

*33. The non-volatile semiconductor storage device according to claim 30, wherein both the first portion and the second portion extend in a first direction.*

*34. The non-volatile semiconductor storage device according to claim 30, wherein both the first portion and the second portion are arranged in a same layer.*

*35. A non-volatile semiconductor storage device comprising:*

*a memory cell array including a plurality of memory cells, the memory cells storing data in a non-volatile manner;*

*a plurality of transfer transistors configured to transfer a voltage to the memory cells, each of the plurality of transfer transistors including a gate electrode formed on a semiconductor substrate via a gate insulation film and drain/source regions formed to sandwich the gate electrode therebetween; and*

*wirings provided above the drain/source regions of the plurality of transfer transistors, each of the wirings including a first portion and a second portion both provided above one of the drain/source regions, the first portion being connected to the one of the drain/source regions via a contact and the second portion being led from the first portion and extending toward a gate electrode side above the one of the drain/source regions,*

*wherein the plurality of transfer transistors share the gate electrode, and*

*the wirings are separately disposed for one or two of the plurality of transfer transistors.*

*36. The non-volatile semiconductor storage device according to claim 35, wherein the second portion is not connected to the one of the drain/source regions directly via a contact.*

*37. The non-volatile semiconductor storage device according to claim 35, further comprising a row decoder selecting a word line provided above the memory cell array, wherein the transfer transistors are included in the row decoder.*

*38. The non-volatile semiconductor storage device according to claim 35, wherein both the first portion and the second portion are arranged in a same layer.*

* * * * *